United States Patent [19]

Gourdine

[11] Patent Number: 5,422,787
[45] Date of Patent: Jun. 6, 1995

[54] APPARATUS AND METHOD FOR COOLING HEAT GENERATING ELECTRONIC COMPONENTS IN A CABINET

[75] Inventor: Meredith C. Gourdine, Houston, Tex.

[73] Assignee: Energy Innovations, Inc., Houston, Tex.

[21] Appl. No.: 215,376

[22] Filed: Mar. 21, 1994

Related U.S. Application Data

[63] Continuation-in-part of Ser. No. 952,308, Sep. 28, 1992, Pat. No. 5,297,005.

[51] Int. Cl.$^6$ .............................................. H05R 7/20
[52] U.S. Cl. .................................... 361/697; 361/695
[58] Field of Search ............................... 361/687–697

[56] References Cited

U.S. PATENT DOCUMENTS 5,297,005  3/1994  Gourdine ............................. 361/697

FOREIGN PATENT DOCUMENTS 2585918  2/1987  France ............................... 361/694
148898  11/1981  Japan ................................. 361/690

OTHER PUBLICATIONS

Damm, Jr. "Convection Cooling Apparatus" IBM Tech. Disc. Bulletin, vol. 20, No. 7, Dec. 1977, pp. 2755–2757.
Antonetti et al, "Air Jet Spot Cooling" IBM Tech. Disc. Bulletin, vol. 19, No. 12, May 1977, pp. 4688–4689.

Primary Examiner—Gregory D. Thompson
Attorney, Agent, or Firm—Kenneth A. Roddy

[57] ABSTRACT

Electronic components in a cabinet are cooled by enclosing and isolating predetermined heat generating electronic components which may include those with heat sinks from other electronic components in the cabinet and providing a dedicated air flow pathway to conduct a stream of air from the cabinet exterior, across the isolated electronic components, and exhaust it to the cabinet exterior. The dedicated air flow is isolated from the ambient air in the cabinet such that the isolated heat generating components are cooled independently of the non-isolated components and the heat generated by the isolated components and non-isolated components is not mixed within the cabinet to maximize cooling of all components within the cabinet. Cooling efficiency is increased by creating turbulence in the dedicated stream of air which passes across the isolated heat generating component or the fins of the heat sink before being exhausted and by providing specially designed inlet and outlet conduits to improve the flow rate and to reduce the pressure drop across the heat generating electronic component.

31 Claims, 7 Drawing Sheets

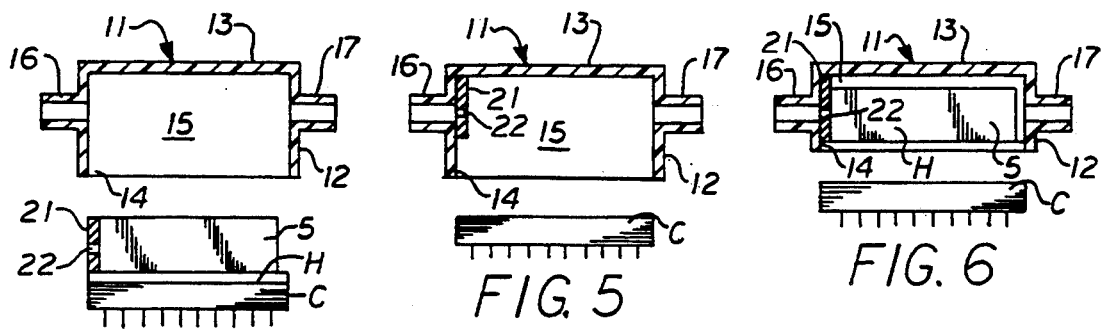
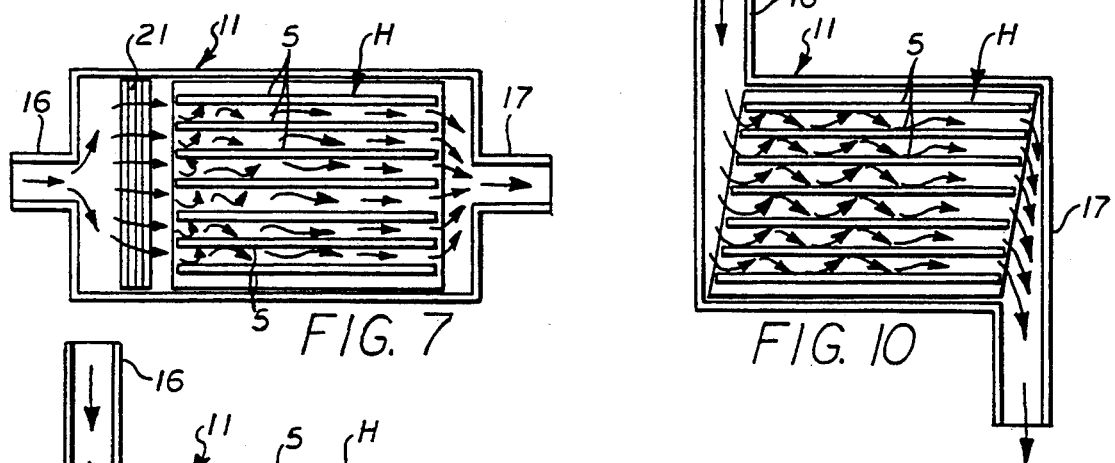
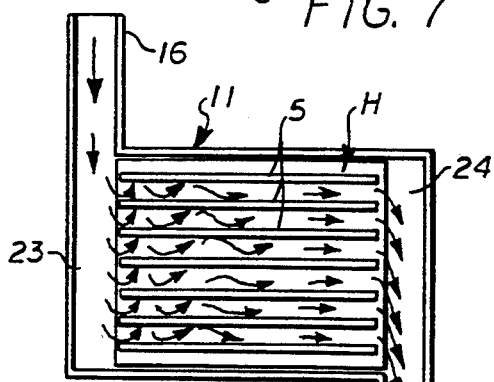
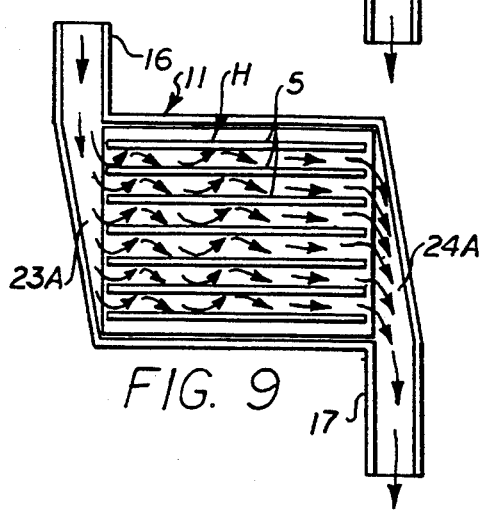
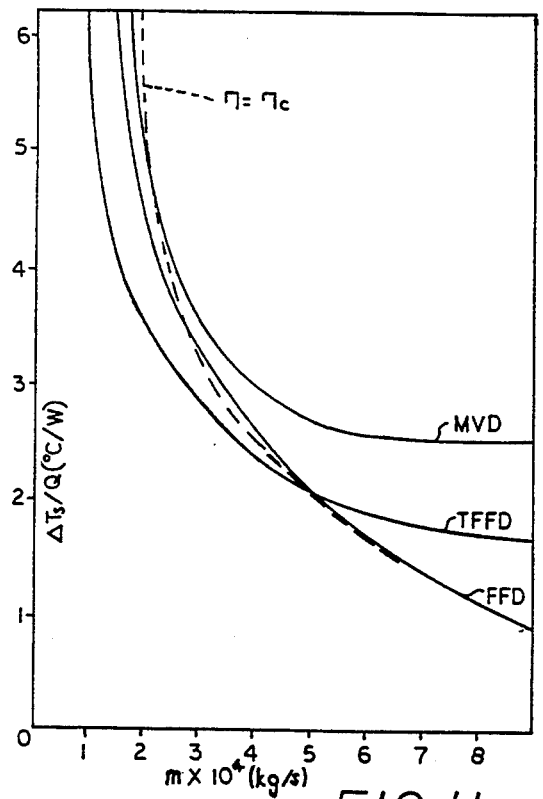

APPARATUS AND METHOD FOR COOLING HEAT GENERATING ELECTRONIC COMPONENTS IN A CABINET

CROSS-REFERENCE TO RELATED APPLICATION

This application is a continuation-in-part of U.S. patent application Ser. No. 07/952,308, filed Sep. 28, 1992, now U.S. Pat. No. 5,297,005.

BACKGROUND OF THE INVENTION

1. Field of the Invention

This invention relates generally to apparatus and methods for cooling electronic heat generating components within a cabinet and more particularly to a method and apparatus for cooling electronic components wherein predetermined heat generating electronic components are isolated from other electronic components in the cabinet and are cooled by a dedicated air flow pathway which is isolated from ambient air in the cabinet such that the heat generated by the isolated components and non-isolated components is not mixed within the cabinet to maximize cooling of all components within the cabinet.

2. Brief Description of the Prior Art

A common problem in electronic packaging is that the heat generated by the electronic components in the cabinet is detrimental to the components themselves, particularly integrated circuits and microprocessor chips in computer cabinets. Heat is normally removed by circulating air across the components by one or more low powered exhaust fans mounted in or on the computer cabinet.

The microprocessor chip in a computer generates a relatively large amount of heat and is susceptible to error or damage caused by overheating. For example, the Intel 80486 microprocessor chip generates 4.5 watts in normal operation and must be maintained below 85 degrees C. or it can introduce error as well as reduce its operating life. Even newer chips will generate 15-30 watts. To assist heat removal from an integrated circuit chip, a heat sink is often mounted on the top surface of the chip. Heat sinks are metal devices that have a plurality of fins or pins extending from a base which is mounted on the chip surface to transmit heat from the chip to the circulating air. The fins are usually aligned longitudinally with the prevalent direction of air flow and when the air flow direction is uncertain, pin-type heat sinks may be used.

The resistance to heat transfer from the hot surfaces to the air is provided primarily by the thin laminar boundary layers that grow on surfaces as the air flows along them. To reduce the thickness of these boundary layers, and hence their thermal resistance, the conventional approach is to reduce the length of the fins in the direction of air flow or to stagger them so the laminar boundary layers are broken and begin to grow from the leading edge of each cut or staggered fin. Heat sinks built with cut or staggered fins are far more expensive than heat sinks with uninterrupted fins, because the former requires a complicated machining or molding process and the latter can be made by a simple extrusion process.

The exhaust fan in a computer cabinet usually develops a single air flow path wherein air from the cabinet exterior is drawn in through inlet slots in the cabinet wall flows across the components including the heat sink and is exhausted through exhaust slots in the fan motor housing in another wall of the cabinet. Although the heat sink is useful in cooling the microprocessor chip, the heat generated by the heat sink is mixed with the heat generated by the other components in the cabinet such that the effective cooling of all the components including the ones having heat sinks is diminished.

In some computer cabinets, such as laptop and notebook computers, there is no fan in the cabinet or case, because the fan presents a relatively large drain on their batteries. CPUs now in laptop and notebook computers, especially those for 80486 chips, must be run more slowly to avoid over heating. Many laptop and notebook computers are built with two speeds: (1) slow speed for operating on battery power, and (2) high speed for plugging into an electrical outlet. However, in the latter case there is danger that the chip will overheat.

Because of the compact space requirements there is often insufficient space in some laptop and notebook computers to utilize components with finned heat sinks. Some manufacturers of notebook and laptop computers provide an aluminum heat spreader 1/16" to ⅛" thick between a pair of circuit boards that extends across almost the entire computer cabinet. The purpose of the heat spreader is to conduct heat to it's periphery, where it can be radiated to the case (usually plastic) and then delivered to the environment by free convection. Obviously, this path has a high thermal resistance, and a powerful high frequency 80486 chip may still overheat if running full speed.

Japanese patent 56-148898 shows a circuit board that has a divider with raised walls with some components having a heat sink disposed inside the walls and some components outside the walls. The board is installed in a slot in the computer chassis and air is drawn by the fan through the slots and through an angled inlet of the divider. The divider wall elements are no taller than the fins of the heat sink and are positioned only on two sides. Thus, the divider does not enclose the heat generating components, and the air passing through the divider elements becomes heated by the first components and more heat is added by the successive heat generating components as the air travels downstream and is less effective in cooling the downstream components. This heated air will also pass over the divider walls and mix with the air drawn through the slots and will heat the air passing over the other components and throughout the cabinet such that effective cooling of all the components in the cabinet is diminished.

An IBM Technical Disclosure Bulletin, Volume 19, No. 12, May 1977 discloses a method of fitting a heat generating module with an air shroud. The air shroud has an inlet port connecting to a pressurized air line and an exhaust port which just exhausts air to the exterior of the shroud into the cabinet. The high pressure, high velocity air is directed over the top surface and over the underside of the heat generating module (the chip, substrate, and can). The heat generating chip and substrate are enclosed by the can which serves as a heat sink and together they form the heat generating module. These components are enclosed in the shroud. The hot air inside the can passes through the pins where it is transferred to the card column air flow in the cabinet. The air inside the shroud passing over the top surface and over the underside of the heat generating module is heated by the module, and this heated air is exhausted through the exhaust port of the shroud into the cabinet where it would be mixed with the heated air of the card column air flow such that effective cooling of all the components in the cabinet is diminished.

Others have attempted to solve the heating problem by mounting a small supplementary fan on the heat sink, and mounting liquid cooling devices (water jackets) or devices utilizing the Peltier effect on the chip to be cooled.

The present invention overcomes the heating problem by enclosing and isolating predetermined heat generating electronic components which may include those with heat sinks from other electronic components in the cabinet and providing a dedicated air flow pathway to conduct a stream of air from the cabinet exterior, across the isolated electronic components, and exhaust it to the cabinet exterior. The dedicated air flow is isolated from the ambient air in the cabinet such that the isolated heat generating components are cooled independently of the non-isolated components and the heat generated by the isolated components and non-isolated components is not mixed within the cabinet to maximize cooling of all components within the cabinet. Cooling efficiency is increased by creating turbulence in the dedicated stream of air which passes across the isolated heat generating component or the fins of the heat sink before being exhausted and by providing specially designed inlet and outlet conduits to improve the flow rate and to reduce the pressure drop across the heat generating electronic component.

SUMMARY OF THE INVENTION

It is therefore an object of the present invention to provide an apparatus and method for effectively cooling heat generating electronic components in a cabinet.

It is another object of this invention to provide an apparatus and method for effectively cooling heat generating electronic components in a cabinet which isolates predetermined heat generating electronic components which may include those with heat sinks from other electronic components in the cabinet and provides a dedicated isolated air flow pathway from the cabinet exterior across the isolated electronic components and to the cabinet exterior.

Another object of this invention is to provide an apparatus and method for effectively cooling heat generating electronic components in a cabinet which isolates predetermined heat generating electronic components from other electronic components in the cabinet and provides a dedicated air flow pathway across the isolated heat generating components which is isolated from the ambient air in the cabinet whereby the isolated components are cooled independently of the non-isolated components, and the heat generated by the isolated components and non-isolated components is not mixed within the cabinet to maximize cooling of all components within the cabinet.

Another object of this invention is to provide a cabinet for housing electronic components which includes a dedicated air flow pathway and an enclosure to enclose heat generating components and provide the enclosed components with a dedicated air flow pathway across the isolated heat generating components which is isolated from the ambient air in the cabinet whereby the isolated components are cooled independently of the non-isolated components, and the heat generated by the isolated components and non-isolated components is not mixed within the cabinet to maximize cooling of all components within the cabinet.

Another object of this invention is to provide an apparatus and method for effectively cooling heat generating electronic components in a cabinet which isolates predetermined heat generating electronic components from other electronic components in the cabinet and provides a dedicated air flow pathway across the isolated heat generating components which reduces the formation of a thick laminar boundary layer of air by inducing turbulence into the dedicated air stream which flows across the heat generating electronic component.

Another object of this invention is to provide an apparatus and method for effectively cooling heat generating electronic components in a cabinet which isolates predetermined heat generating electronic components from other electronic components in the cabinet and provides a dedicated air flow which induces turbulence in the air flowing across the isolated heat generating components in the form of a multiplicity of small vortices which flow across the heat generating electronic component.

Another object of this invention is to provide an apparatus and method for effectively cooling heat generating electronic components in a cabinet which isolates predetermined heat generating electronic components having a finned heat sink thereon from other electronic components in the cabinet and provides a dedicated air flow which induces turbulence in the air stream at the leading edge of the fin by directing the incoming flow transversely across the edges of the fins so that turbulence is induced as flow peels off the main stream and turns to flow between the fins.

Another object of this invention is to provide an apparatus and method for effectively cooling heat generating electronic components in a cabinet which isolates predetermined heat generating electronic components having a finned heat sink thereon from other electronic components in the cabinet and provides a dedicated air flow transverse to the fins which induces turbulence in the air stream at the leading edge of the fin and reduces the cross sectional area of the incoming flow across the edges of the fins so that turbulence is induced as flow peels off the main stream and flows between the fins such that the transverse speed remains constant and the amount of induced turbulence between each pair of fins is the same.

Another object of this invention is to provide an apparatus and method for effectively cooling heat generating electronic components in a cabinet which isolates predetermined heat generating electronic components having a finned heat sink thereon from other electronic components in the cabinet and provides a dedicated air flow across the fins through tapered inlets and outlets which are angled transverse to the fins which induces turbulence in the air stream at the leading edge of the fin and minimizes the induction of turbulence and associated pressure loss as the air flows out of the fins at the trailing edge of the fins.

Another object of this invention is to provide an apparatus and method for effectively cooling heat generating electronic components in a cabinet which isolates predetermined heat generating electronic components from other electronic components in the cabinet and provides a dedicated air flow across the isolated components through inlet and outlet conduits which reduce the pressure drop across the isolated component.

Another object of this invention is to provide an apparatus and method for effectively cooling heat generating electronic components in a cabinet which isolates predetermined heat generating electronic components which may include those with heat sinks from other electronic components in the cabinet and provides a dedicated isolated air flow pathway from the cabinet exterior across the isolated electronic components and to the cabinet exterior wherein the dedicated air flow is created by an auxiliary exhaust fan, and/or an auxiliary blower.

Another object of this invention is to provide an apparatus and method for effectively cooling heat generating electronic components in a cabinet which isolates predetermined heat generating electronic components from other electronic components in the cabinet and provides a dedicated isolated air flow pathway from the cabinet exterior across the isolated electronic components and to the cabinet exterior through highly flexible corrugated tubes or conduit having a smooth interior surface that do not kink when bent and produce minimal pressure drop in the air flowing therethrough.

Another object of this invention is to provide a cooling apparatus which can be installed quickly and easily on heat generating electronic components within a cabinet without modification to the existing equipment.

Another object of this invention is to provide a cooling apparatus that can be installed quickly and easily on integrated circuit chips including those with heat sinks which allows upgrading and replacement of low powered chips with high powered chip without having to change the existing thermal management equipment.

A further object of this invention is to provide a cooling apparatus which will improve the thermal management system of cabinets containing heat generating electronic components.

A still further object of this invention is to provide a cooling apparatus for installation on heat generating electronic components which is simple in construction and inexpensive to manufacture.

Other objects of the invention will become apparent from time to time throughout the specification and claims as hereinafter related.

The above noted objects and other objects of the invention are accomplished by enclosing and isolating predetermined heat generating electronic components which may include those with heat sinks from other electronic components in the cabinet and providing a dedicated air flow pathway to conduct a stream of air from the cabinet exterior, across the isolated electronic components, and exhaust it to the cabinet exterior. The dedicated air flow is isolated from the ambient air in the cabinet such that the isolated heat generating components are cooled independently of the non-isolated components and the heat generated by the isolated components and non-isolated components is not mixed within the cabinet to maximize cooling of all components within the cabinet. Cooling efficiency is increased by creating turbulence in the dedicated stream of air which passes across the isolated heat generating component or the fins of the heat sink before being exhausted and by providing specially designed inlet and outlet conduits to improve the flow rate and to reduce the pressure drop across the heat generating electronic component.

BRIEF DESCRIPTION OF THE DRAWINGS

FIG. 4 is a side view in partial cross section of the component cooling enclosure being installed on an integrated circuit chip with a heat sink mounted thereon.

FIG. 5 is a side view in partial cross section of the component cooling enclosure being installed on an integrated circuit chip without a heat sink.

FIG. 6 is a side view in partial cross section of the component cooling enclosure being installed on an integrated circuit chip wherein the heat sink is mounted within the cooling enclosure and the assembly is installed as a unit.

FIG. 7 is a top plan view of the apparatus of FIG. 2 showing schematically how air entering the enclosure around the heat sink can be converted to a multi-vortex flow that converts to turbulence upon entering the fins of the heat sink.

FIG. 8 is a top plan view of an enclosure positioned over an integrated circuit chip having a finned heat sink mounted thereon showing schematically how an inlet flow to the enclosure transverse to the heat sink fins induces turbulence between the fins, but in non-uniform amounts.

FIG. 9 is a top plan view of an enclosure positioned over an integrated circuit chip having a finned heat sink mounted thereon showing schematically how a tapered inlet and outlet on the enclosure causes uniform induced turbulence between the fins with minimal flow separation at the exit of the fins.

FIG. 10 is a top plan view of an enclosure positioned over an integrated circuit chip having a finned heat sink mounted thereon showing schematically an alternate arrangement wherein the heat sink ends are tapered rather than the inlet and outlets of the enclosure.

FIG. 11 is a graph showing a plot of thermal resistance vs. mass flow rate for the embodiments of FIGS. 7–10 of comparable size.

DESCRIPTION OF THE PREFERRED EMBODIMENTS

Integrated circuit chips, such as microprocessor chips generate a relatively large amount of heat and are susceptible to error or damage caused by overheating. For example, the Intel 80486 microprocessor chip generates 4.5 watts in normal operation and must be maintained below 85° C. or it can introduce error as well as reduce its operating life due to overheating. The integrated circuit chip is usually mounted with many other components on circuit board in a cabinet which has a fan that draws air in from the cabinet exterior, circulates the air across all the electronic components, and then exhausts the air to the cabinet exterior in a single air flow path to cool the components. To assist heat removal from an integrated circuit chip, a heat sink is often mounted on the top surface of the chip by thermal adhesive, mechanical slots, or a combination thereof.

The conventional heat sink is a metal device having a plurality of fins or pins extending from a base which is mounted on the chip surface to radiate or transmit heat from the chip to the circulating air. The fins are usually aligned longitudinally with the prevalent direction of air flow and when the air flow direction is uncertain, pin-type heat sinks may be used.

Figure 1:
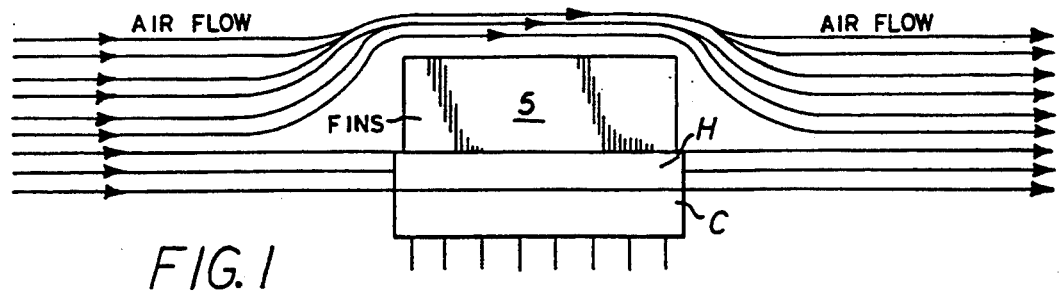
FIG. 1 is a schematic elevation view of an integrated circuit chip with a conventional heat sink mounted thereon in accordance with the prior art showing the air flow path around the heat sink.

Referring to the drawings by numerals of reference, there is shown schematically in FIG. 1, the air flow path through and around an integrated circuit chip C with a conventional heat sink H mounted thereon in accordance with the prior art to assist heat removal from the integrated circuit chip. The heat sink H has longitudinally extending parallel fins 5. As indicated by arrows in FIG. 1, in cabinets having an internal fan, some of the air flow is deflected around the heat sink H due to friction exerted on the flow as it passes through the fins 5. Part of the heat in the heat sink is carried away by the relatively high speed flow of air through the closely spaced fins 5 (convection), while the rest of the heat is conducted to the relatively slow speed flow above the heat sink. Convective heat transfer is generally more effective than conductive heat transfer.

The resistance to heat transfer from the hot surfaces to the air is provided primarily by the thin laminar boundary layers that grow on the fin surfaces as the air flows along them. To reduce the thickness of these boundary layers, and hence their thermal resistance, the conventional approach is to reduce the length of the fins in the direction of air flow or to stagger them so the laminar boundary layers are broken and begin to grow from the leading edge of each cut or staggered fin.

Although mounting heat sinks to the heat generating chip will facilitate cooling of the chip to some extent, the heat generated by the heat sink is mixed with the heat generated by the other components in the cabinet such that the effective cooling of all the components including the ones having heat sinks is diminished.

My copending U.S. patent application Ser. No. 07/952,308 teaches apparatus and methods of using a dedicated stream of air to cool a particularly hot component within a system containing other less hot components being cooled by forced convection induced by a fan or fans within the system. The dedicated stream flows into the environment of the system through a flexible or fixed duct into an enclosure around the hot component in question, and then through a flexible or fixed duct into the enclosure which houses the exhaust fan of the system. Generally, the flow in a dedicated stream is small compared to the flow over the other components. Since the two streams of air do not mix within the system, cooling of the hot components by a dedicated stream and cooling of the other components by a forced draft are both more effective processes. Also, since the air cooling the hot component comes directly from the environment around the system rather than from air within the system that has been preheated by other components, cooling of the hot component is enhanced.

The present invention is directed toward apparatus and methods for improving the cooling effect of the dedicated stream within the enclosure that surrounds the heat generating electronic component which usually has a finned heat sink.

FIGS. 2–6 illustrate apparatus for improving the cooling effect of the dedicated stream within the enclosure by inducing turbulence in the isolated air flow pathway which reduces the formation of a thick laminar boundary layer of air on the surface of the heat sink or the heat generating electronic component.

Figure 2:
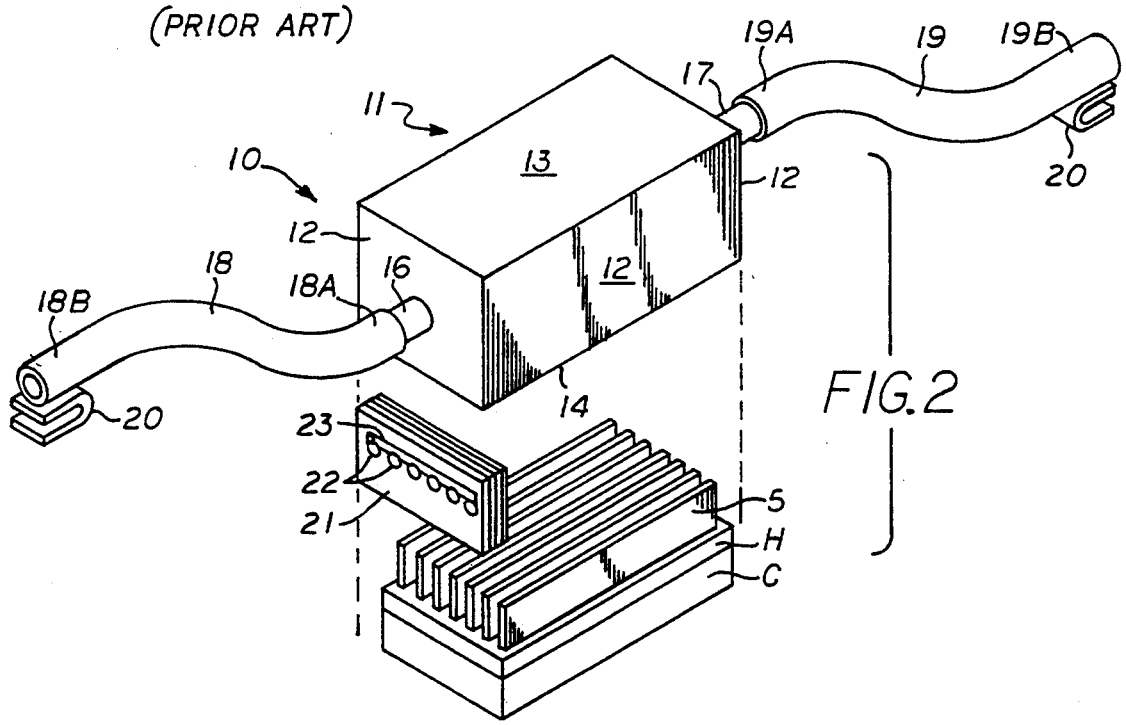
FIG. 2 is an exploded isometric view of an embodiment of the apparatus in accordance with the present invention being placed over an integrated circuit chip with a heat sink mounted thereon.

Referring now to FIGS. 2 and 4, there is shown a cooling apparatus 10 in accordance with the present invention. The cooling apparatus 10 has a hollow housing 11 formed of electrically non-conductive material configured to enclose the heat generating electronic component C. In the illustrated embodiment, the housing 11 is a box-like enclosure having opposed side walls 12, a top wall 13, and an open bottom end 14 defining an interior cavity 15. An inlet port 16 is provided through one side wall and an outlet port 17 is provided through another side wall. A length of flexible conduit 18 is connected at one end 18A to the inlet port 16 and another length of flexible conduit 19 is connected at one end 19A to the outlet port 17. For purposes of illustration, only one component C is shown, however, it should be understood that the housing 11 may be sized to enclose more than one component.

Figure 3:
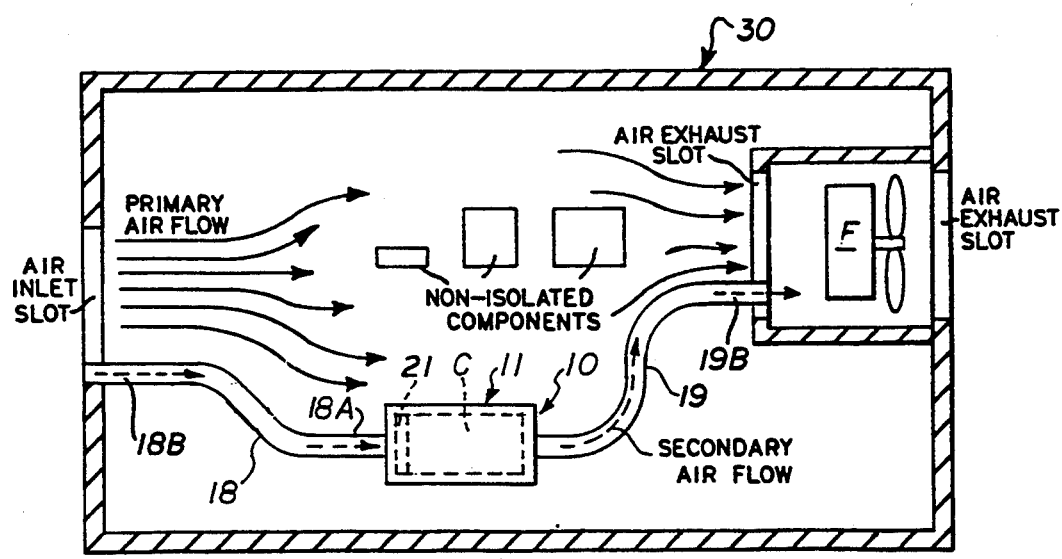
FIG. 3 is a schematic plan view of a computer cabinet with the apparatus in accordance with the present invention installed over a component to be cooled.
Figure 3A:
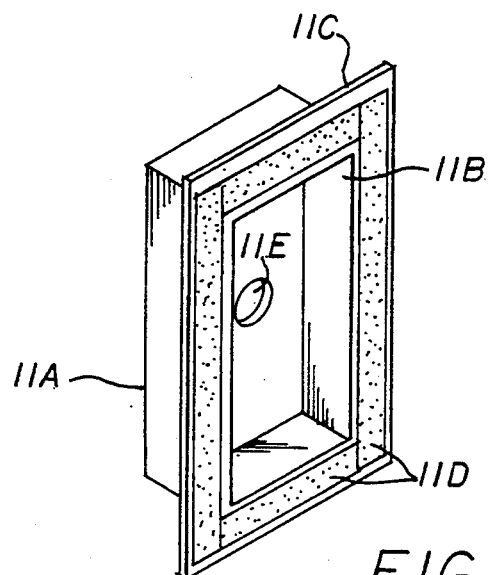
FIGS. 3A and 3B show a box-like enclosure which is installed over a portion of the slots in the fan housing and the free end of a conduit thereto.
Figure 3B:
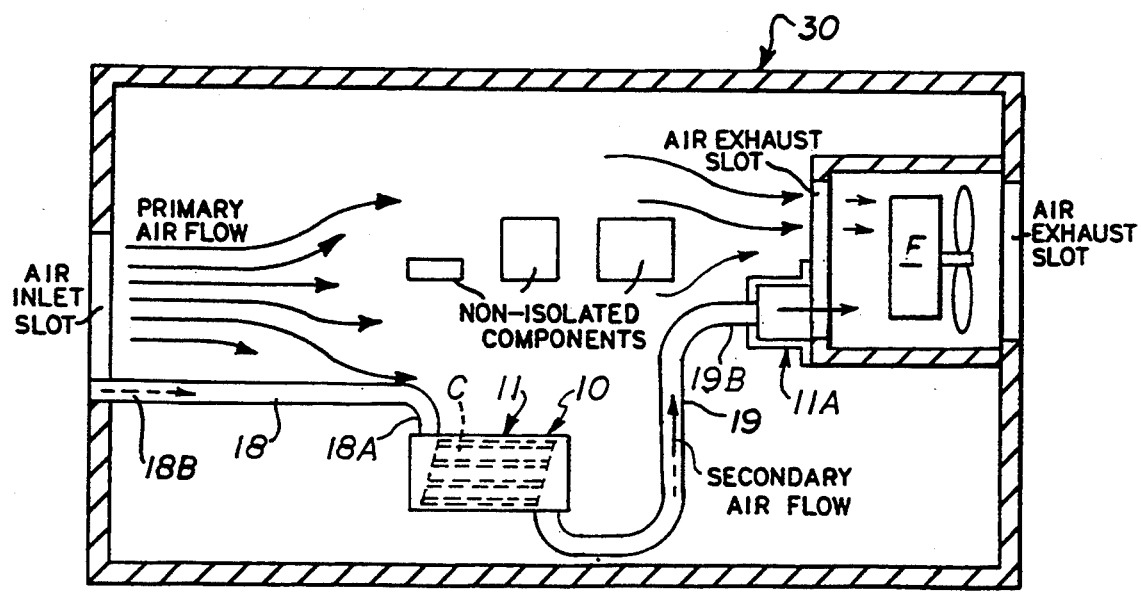

As shown in FIG. 3, the free end 18B of the conduit 18 is adapted to be releasably attached to the side wall of a cabinet 30 in which the component C to be cooled is mounted and in fluid communication with the cabinet exterior. In cabinets of the type having an internal fan, there is usually at least one inlet slot through which fresh air normally enters. In cabinets which do not have an existing air inlet slot, one may be formed in the side wall. The free end 19B of the conduit 19 is also in fluid communication with the cabinet exterior. In cabinets having an internal fan, the free end 19B of the conduit 19 may be adapted to be releasably attached to a slot in the fan housing, or, as seen in FIGS. 3A and 3B, a small box-like housing 11A having an open bottom 11B surrounded by a flange 11C may be attached by double-sided tape 11D over a portion of the fan housing slots and the free end 19B of the conduit 19 installed in a hole 11E in the wall of the enclosure. In cabinets without an internal fan, the free end 19B of the conduit 19 may extend through an aperture formed in the side wall of the cabinet 30 and connected in fluid communication with an external fan. It should be understood that either end 18B or 19B may be connected to an external fan or an external blower to create the flow of air through the conduit and enclosure housing 11.

Suitable mounting hardware, such as clips 20 (FIG. 2), may be secured to the free ends of the conduits 18 and 19 for attaching their free ends to the cabinet side wall and/or fan housing. In some instances, depending upon the size of the cabinet and fan housing slots, the free ends 18B and 19B of the conduits 18 and 19 may be simply inserted in the inlet and exhaust slots without requiring mounting hardware.

FIGS. 2–6 show a turbulence inducing member 21 which is mounted transverse to the inlet air flow at the leading edge of the fins 5 of the heat sink H and has a plurality of apertures 22 therethrough that cause the air flow to form a plurality of small adjacent vortices of air which are focused to flow directly between the fins of the heat sink within the enclosure or directly over the hot component to be cooled, before leaving the outlet. The turbulence inducing member 21 may also be provided with a series of grooves 23 (FIG. 2) which direct the air flow tangentially into the apertures 22 to impart rotation to the vortices.

Several devices for inducing turbulence in the form of a multiplicity of small vortices is shown in my U.S. Pat. No. 4,850,537, which is hereby incorporated by reference. U.S. Pat. No. 4,850,537 discloses a multivortex device comprising a series of adjacent plates with specially designed grooves and perforations which, when mounted transversely of a uniform fluid flow in a duct, results in the formation of numerous small adjacent flow vortices either all rotating in the same direction (co-vortices) or adjacent vortices rotating in the opposite direction (counter-vortices).

The small adjacent vortices of air focused to flow directly between the fins of the heat sink or directly over the hot component reduce the thickness of the thin laminar boundary layers which resist heat transfer from the hot surfaces to the air, and thus, their thermal resistance.

FIG. 4 shows an embodiment of the cooling enclosure 11 wherein the component to be enclosed is an integrated circuit chip C having a heat sink H with fins 5 mounted thereon. The open bottom end 14 of the housing or cooling enclosure 11 is configured to engage the top surface or sides of the component C to be cooled and the interior cavity 15 is sized to enclose the component leaving a space between the top of the component and the top wall 13 of the enclosure. The turbulence inducing member 21 is disposed transverse to the inlet port 16 at the leading edge of the fins 5. The open bottom end 14 of the cooling enclosure 10 may be dimensioned to frictionally engage the sides of the component to be cooled, or may be installed on the component using a suitable flexible thermal adhesive.

FIG. 5 shows an embodiment of the enclosure 11 wherein the component to be enclosed is an integrated circuit chip C without a heat sink. The turbulence inducing member 21 is mounted within the enclosure cavity 15 and the open bottom end 14 of the enclosure 11 is configured to engage the sides of the chip C. A suitable thermal adhesive may used to secure the enclosure to the chip C.

FIG. 6 shows an embodiment of the cooling enclosure 11 wherein the turbulence inducing member 21 and a heat sink H is installed in the enclosure cavity 15 and the enclosure, turbulence inducing member, and heat sink assembly is supplied as a single unit to be mounted on the component to be cooled (integrated circuit chip C).

It should be understood that although a box-like configuration has been illustrated as an example of a preferred embodiment, the cooling enclosure 11 may be cylindrical or configured otherwise to conform to the shape of the component to be cooled. It should also be understood that while flexible conduits are described in the preferred embodiment, that the conduits 18 and 19 may be rigid, or that air passageways may be built into the cabinet chassis and connected to the component enclosure.

Referring again to FIGS. 3 and 3B, in cabinets having an internal exhaust fan, as the exhaust fan F draws a major portion of the outside air over the non-isolated components in the cabinet and through the exhaust slots in the fan housing. Simultaneously, a small portion of outside air, or "isolated air flow" is drawn into the free end 18B of the conduit 18 from the air inlet slot in the cabinet and passes through the conduit into the enclosure 11, through the turbulence inducing member 21, and across the isolated component C and through the outlet conduit 19 to be exhausted by the fan. If the component has a heat sink, the air flows directly between the fins 5 of the heat sink.

Sufficient air flow is drawn across the isolated component C and through the fins of the heat sink to achieve improved cooling of the isolated component without jeopardizing the cooling effects of the outside air circulating across the other non-isolated components (primary air flow). As a result, cooling of the other non-isolated components by the circulating air outside of the enclosure is improved because the primary air flow through the cabinet is not mixed with the isolated hot air emerging from the isolated component or heat sink. Also the air of the isolated air flow which cools the isolated component or heat sink is not mixed with heat from the other warm non-isolated components inside the cabinet. Thus, a double benefit is achieved by the separate primary and isolated cooling flows of air.

FIG. 7 shows schematically the turbulence inducing member 21 installed in the enclosure 11, just upstream from the fins 5 of the heat sink H. Fluid (air) flows through the inlet port 16 and through the turbulence inducing member 21 to form a multiplicity of vortices, represented by arrows, that are converted into turbulence as they enter the space between the fins 5. This three dimensional turbulent flow prevents the growth of laminar boundary layers that would normally reduce heat transfer on the surfaces.

If the mean speed of induced turbulence at the inlet of the fins is $u_t$, the distance between fins is $\beta$, the length of the fins is L, and the speed of the fluid through the fins is u; then it can been shown that the rate of decay of mean turbulent speed due to viscosity of the fluid $\mu$, with density $\rho$ is given by:

$$v_t(x)/v_t(0) \approx \exp\{-(4x/\beta)/Re(\beta)\} \quad (1)$$

where the Reynold's number for this flow is:

$$Re(\beta) = \rho u \beta/\mu \quad (2)$$

where it is assumed that the initial mean speed of turbulence equals the rotational speed of the vortices, v. In most cases of interest, the mean turbulent speed persists for $L/\beta \gg 1$.

It has also been shown theoretically and verified experimentally that the efficiency with which the fluid is used to transfer heat from the fins is given by:

$$\eta = (T_o - T_i)/(T_s - T_i) \approx 1 - \exp\{-(v/u)(L/\beta)/4\} \quad (3)$$

where $T_s$ is the chip surface temperature, $T_o$ is the outlet temperature and $T_i$ is the inlet temperature of the air into the device. This approximation is valid in most cases of interest where $Re(\beta) \gg 4$ $L/\beta \gg 1$. For example, if $L/\beta \approx 8$ and $v/u \approx 1$, then $\eta \approx 0.89$, which means that fluid has used up $\approx 89\%$ of its ability to pick up heat. If used up 100%, its exit temperature would be $T_o = T_s$, the temperature of the fins.

FIG. 8 shows schematically another method of introducing turbulence at the inlet to the fins, thereby destroying the laminar boundary layer and increasing the heat transfer rate. In the embodiment of FIG. 8, the inlet port 16 and outlet port 17 of the enclosure 11 are transverse to the longitudinal axis of the fins 5 and the enclosure 11 has an open area at each end of the fins to serve as an inlet chamber or reservoir 23 and an outlet chamber or reservoir 24. In this case, the fluid (air) enters through the inlet port 16 into the inlet reservoir 23, where it flows transversely across the ends of the fins 5, peeling off to flow along the fins with speed u.

In this process, turbulence is induced at the inlet to the fins as a result of the sharp turns. The turbulent eddies, represented by arrows, induced by this process are transported between the fins with speed u, and it has been shown that the initial mean speed of this turbulence is approximately v, the transverse speed across the fin. Since v steadily decreases with distance from the inlet port 16, the mean speed of turbulence between the fins far from the inlet port 16 is substantially less. Thus, heat transfer rates are not as large between the fins far from the inlet port.

Moreover, as fluid (air) leaves the fins 5 and enters the outlet chamber or reservoir 24 where the air flow is generally much slower, it converts most of its dynamic pressure $\rho u^2/2$ into turbulence, with an associated loss of pressure.

Of course, there are also pressure losses due to a mismatch in the cross-sectional area of the inlet port 16 with the cross-sectional area of the inlet reservoir 23, and a mismatch between the cross-sectional areas of the outlet port 17 and the cross-sectional area of the outlet reservoir 24.

FIG. 9 shows schematically a method of minimizing the pressure losses mentioned above by matching the cross sectional areas of the inlet port 16 and outlet port 17 with the cross sectional areas of the inlet and outlet reservoirs 23 and 24, respectively. In the embodiment of FIG. 9, the inlet and outlet ports 16 and 17 of the enclosure 11 are tapered and gradually change from a circular to a rectangular cross-section to provide a tapered inlet reservoir 23A and tapered outlet reservoir 24A.

The tapered inlet reservoir 23A is dimensioned to make the transverse speed v uniform at the inlet to all of the fins, thereby making the same amount of induced turbulence between each pair of the fins as shown schematically in the figure. Also, at the exit of the fins, the transverse speed is also v, independent of location; consequently, there is less loss of dynamic pressure $\rho u^2$ as the fluid leaves the fins and enters the moving air in the outlet reservoir 24A. This tapered inlet and outlet arrangement or "Tapered Focused Flow Heat Sink" (TFFHS) induces turbulence primarily where it is needed most, at the inlet to the fins, with a minimum pressure drop anywhere else.

FIG. 10 shows another embodiment of the "Tapered Focused Flow Heat Sink" (TFFHS) in which the fins 5 of the heat sink H are offset at an angle (tapered) rather than the inlet and outlet reservoirs 23A and 24A of the enclosure 11. However operating principles remain the same.

FIG. 11 is a graph showing a plot of experimental results for the focused flow heat sinks (TFFHS) discussed above; i.e. thermal resistance $\Delta T_s/Q$ vs. mass flow rate, m, where $\Delta T_s = T_s - T_i$. Note that the first law of thermodynamics can be used to derive the following expression for thermal resistance, i.e., $$\Delta T_s/Q = \eta_c/(m\,c\,\eta) \quad (4)$$

Here, $\eta_c$ is the convective heat transfer efficiency; i.e., the ratio of heat carried away by the air compared to the heat delivered to the heat sink. The ideal condition in which $\eta = 1$ is shown in dashed lines. The line labeled "MVD" represents the "Multi-Vortex Device" described with reference to FIG. 7, The line labeled "FFD" represents the "Focused Flow Device" described with reference to FIG. 8, and the line labeled "TTFD" represent the Tapered Focused Flow Devices" described with reference to FIGS. 9 and 10 above. Note that for small values of m, the actual thermal resistance lies below the idealistic thermal resistance because a significant portion of the heat is conducted through the insulated walls instead of being convected away by the fluid (air).

Figure 12:
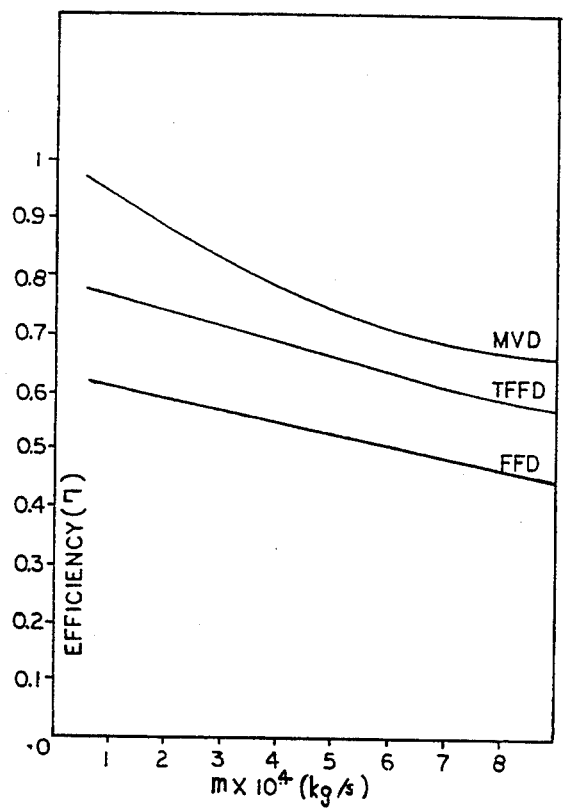
FIG. 12 is a graph showing a plot of heat transfer efficiency vs. mass flow rate for the embodiments of FIGS. 7–10 of comparable size.

FIG. 12 is a plot of experimental results for these devices showing the efficiency $\eta$ vs the mass flow rate m. Note that in the FIG. 7 device "MVD" the turbulence induced by the multi-vortex turbulence inducing member is by far the most efficient. Also note that at large mass flow rates or large $Re(\beta)$, the efficiency approaches an asymptotic limit as predicted by equation (3). This is not the case for the focused flow heat sink without induced turbulence.

Figure 13:
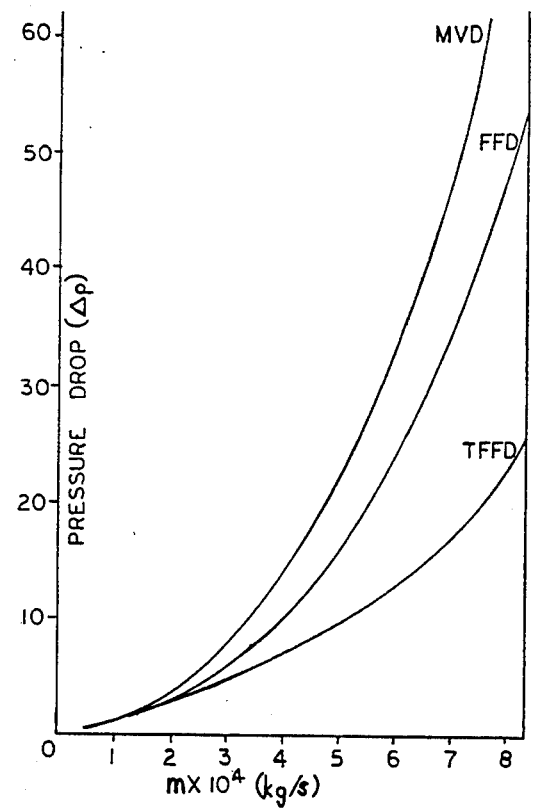
FIG. 13 is a graph showing a plot of pressure drop vs. mass flow rate for the embodiments of FIGS. 7–10 of comparable size.

FIG. 13 is a plot of experimental results for these devices showing pressure drop $\Delta p$ vs. mass flow rate m. Note that the "MVD" device of FIG. 7 with the multi-vortex turbulence inducing member requires the greatest pressure drop; however there is room with further development for decreasing the pressure drop through the multi-vortex turbulence inducing member.

Figure 14:
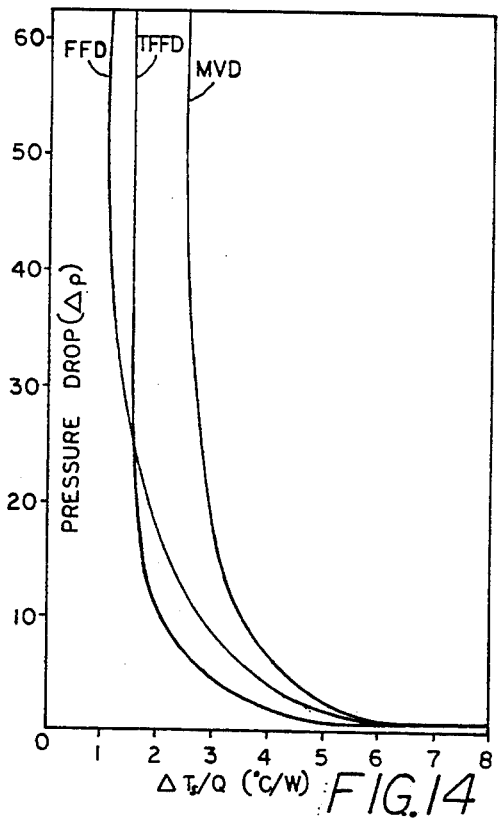
FIG. 14 is a graph showing a plot of pressure drop vs. thermal resistance for the embodiments of FIGS. 7–10 of comparable size.

FIG. 14 shows the experimental results for the pressure drop $\Delta p$ required to obtain a desired thermal resistance, $\Delta T_s/Q$ for each of these devices. This is a useful plot because muffin fans traditionally used to generate flow through heat sinks are severely limited in providing pressure drop.

Figure 15:
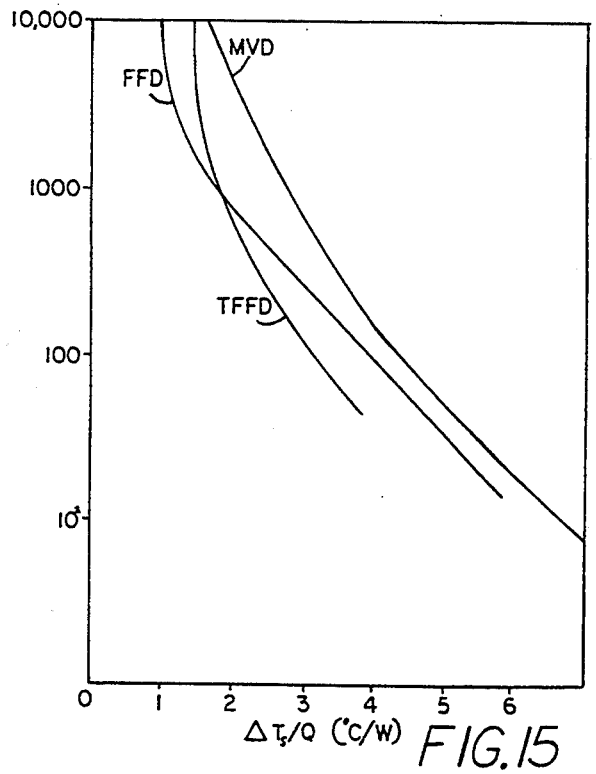
FIG. 15 is a graph showing a plot of fan power vs. thermal resistance for the embodiments of FIGS. 7–10 of comparable size.

FIG. 15 shows fan power, $P = \Delta p\,(m/\rho)$ vs thermal resistance $\Delta T_s/Q$ for these devices. It shows that for any required $\Delta T_s/Q$, the "Tapered Focused Flow Heat Sink" (TFFD) devices of FIGS. 9 and 10 require the least amount of fan power, or the smallest muffin fan. It should be kept in mind that the input power to these fans is much larger than the power delivered to the fluid P due to the inefficiency of these fans.

It should be noted that quite often, the user may add more components to the mother board, which decreases the draft through the computer and increases the vacuum induced by the exhaust fan. This would lead to more air flow through the dedicated air flow passageway of the Tapered Focused Flow Heat Sink "TFFD". Since this is a common occurrence, focused flow heat sinks provide greater reliability than other approaches to cooling the CPU.

The above described examples illustrate relative advantages of inducing turbulence within the focused flow device, preferably where it can do the most good, i.e., on the heat transfer surfaces.

In some computer cabinets, such as laptop and notebook computers, there is no fan in the cabinet or case, because the fan presents a relatively large drain on their batteries. CPUs now in laptop and notebook computers, especially those for '486 chips, must be run more slowly to avoid over heating. In fact, laptops and notebooks are built with two speeds: (1) slow speed for operating on battery power, and (2) high speed for plugging into an electrical outlet. However, in the latter case there is danger that the chip will overheat.

In some laptop and notebook computers there is sufficient space for heat sinks and even for tubular conduit required to drive a Tapered Focused Flow Device "TFFD" as described above. However, when additional cards are placed into auxiliary slots this cuts the useable space to approximately ⅛". Even with the use of an external fan and power supply attached to an external cabinet by a conduit, there still may not be sufficient room for the heat sink. The embodiment shown in FIG. 16 makes use of one of the card slots and an external fan and power supply to cool the heat generating chip.

Figure 16:
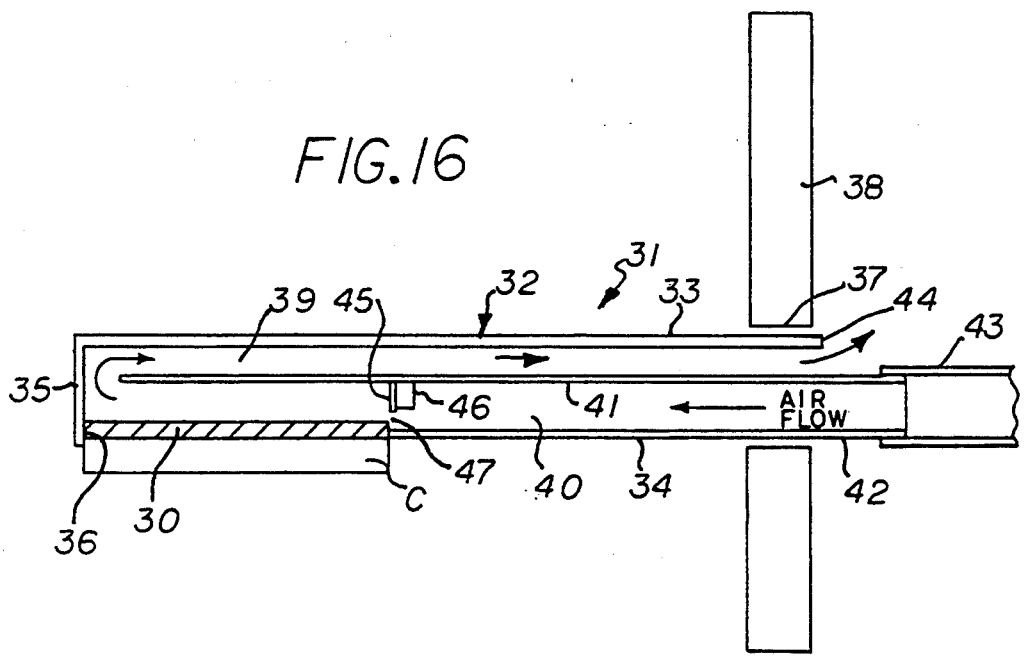
FIG. 16 is a side view in cross section of a thin rectangular enclosure which is positioned over an integrated circuit chip and fits into a slot in the side wall of the cabinet housing.

As shown somewhat schematically in the embodiment of FIG. 16, a flat aluminum heat sink 30 is secured to the CPU C. The focused flow device 31 has a thin rectangular housing 32 with parallel side walls 33 and 34 and an end wall 35. One side wall 34 has an opening 36 near the end wall 35 which fits over and encloses the upper portion of the CPU and heat sink. The opposed end of the rectangular housing 32 extends through a slot 37 in the side wall 38 of the cabinet. The rectangular housing 32 is divided into an upper level 39 and a lower level 40 by a flat plate 41 or sheet of plastic. The outer end of the lower level 40 has an inlet portion 42 configured to receive one end of a conduit 43 which is connected at its other end to an external fan (not shown). The outer end 44 of the upper section 39 is open to define an air outlet which directs air outwardly of the cabinet. The flat plate 41 extends inwardly from the inlet end 42, over the top of the heat sink 30 and terminates a distance inward from the end wall 35.

A thin rectangular plastic strip 45 and a foam rubber strip 46 depend from the underside of the plate 41 adjacent the leading edge of the heat sink 30 and extend transverse to the air flow. The bottom edge of the plastic strip 45 extends beyond the foam rubber strip 46 and terminates approximately 1/16" above the top of the heat sink 30 to form a narrow slot or passageway 47 which induces turbulence in the air flow.

The fan directs air in through the lower level 39 of the focused flow device 31, then through the narrow passageway 47 at the leading edge of the heat sink 30.

The turbulence induced in the air as it flows over the sharp edges of the passageway 47 persist as the air flows over the aluminum heat sink. This provides a sufficiently high heat transfer coefficient for high heat transfer efficiency. The hot air is then turned back over the top of the plastic plate 41 and into the upper level 39 of the focused flow device 31. The air flows through the upper level passageway 39, to the cabinet exterior, and back into the environment. The overall height of the special heat sink is approximately ⅛", and has the same foot print as the CPU that is attached to the chip case with thermal tape. Typically, card slots are approx 2⅛" wide and ¼" to ¾" tall. The focused flow device 31 of FIG. 16 is a special version of a tapered focused flow heat sink. Rather than air turning into a series of passageways between fins to induce turbulence, here it induces turbulence while turning into a single passageway. It has been shown the efficiency of heat transfer processes of such a passageway is given by:

$$\eta \approx 1 - exp(-(v/u[L/4\beta])) \quad (5)$$

where in this case $v/u \approx 1$, is the ratio of the transverse velocity to the velocity between the plates, and $L/\beta$ is the aspect ratio of the passage way of length L and height $\beta$. Typically, with $L \approx \frac{3}{4}"$ and $\beta \approx 1/16"$, $\eta \approx 1-e^{\wedge} -6 \approx 0.999$. This will mean that the air would emerge from the passageway at the heat sink temperature $T_s$. If the maximum allowable operating chip temperature Ts, is 75° C. and ambient temperature Ti $\approx 25°$ C., temperature rise of the chip above the ambient is $\Delta Ts \approx 50°$ C. If this chip generates 10W, then the required thermal resistance is $\Delta Ts/Q \approx 5°$ C./W.

The first law of thermodynamics tells us that the thermal resistance is $$\Delta Ts/Q = 1/(mc\eta) \quad (6)$$

where $c \approx 1000$ J/kg°C. is the heat capacity of the air and m is the mass flow of air. For $\eta \approx 1$, for the required amount of air is m$\approx 2\times 10^{\wedge} -4$ kg/s.

If the size of the chip is 1.5"$\times$1.5", then the cross sectional area of the flow is:

$$A = 1.5" \times 1/16" = 2.4 \times 10^{-5} m^2 \quad (7)$$

It follows, then, that the velocity is:

$$\begin{aligned} u &= m/(\rho A) \quad (8) \\ &= 2 \times 10^{-4}/(12.4 \times 10^{-5}) = 8 \text{ m/s} \end{aligned}$$

We have shown that the pressure drop induced by the turbulence at the turn and the friction on the walls is given by $$\begin{aligned} \Delta p &\approx [\rho u^2/2][C_f 2L/\beta + v^2/u^2] \quad (9) \\ &\approx [1 \times 8^2/2][0.01 \times 2 \times (3/4")/(1/16") + 1] \\ &\approx 40 \text{ N/m}^2 \approx 4 \text{ mm of water pressure.} \end{aligned}$$

The above examples assume that the pressure drop in the passageways of the focused flow device 31 and in the tube or conduit leading to it is negligible, because the flow velocity is so small through these large cross sectional areas. This pressure drop and flow rate can be easily provided by a small fan and power supply in a separate enclosure.

In some computer cabinets, there is a space up to approximately ⅛" between the bottom of the cabinet and the bottom of the main circuit board, and an aluminum plate is used to gather and distribute heat between circuit boards, and then radiate this heat to the top and side walls of the cabinet.

Figure 18:
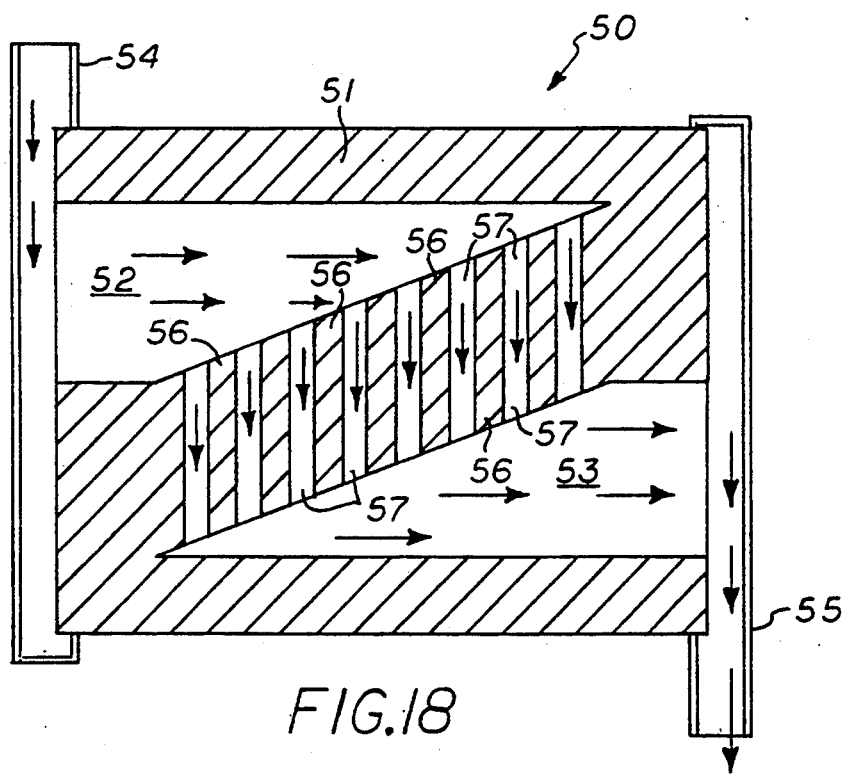
FIG. 18 is a top plan view of the embodiment of FIG. 17 taken along line 18—18 of FIG. 17.
Figure 17:
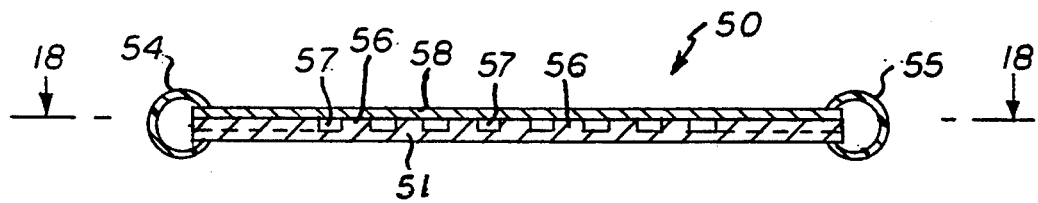
FIG. 17 is a side view in cross section of a thin rectangular focused flow cooling device which may be positioned between the bottom of a cabinet and a circuit board.

FIGS. 17 and 18 show an embodiment of a Tapered Focused Flow Heat Sink (TFFHS) device 50 which utilizes the small space between the bottom of the cabinet and the bottom of the main circuit board to air-cool the entire inside of the computer cabinet, including the CPU. The device 50 also utilizes an external fan and power supply.

The device 50 is formed of a thin flat plate 51 which has a flat tapered slot extending inwardly from each end near the diagonally opposite corners which serve as an inlet reservoir 52 and an outlet reservoir 53 which are connected at their outer ends to an inlet tube 54 and outlet tube 55, respectively. The inwardly extending angled portions of the reservoirs 52 and 53 are spaced apart. The portion of the plate between the angled reservoirs is provided with a plurality of fins 56 with passageways 57 therebetween transverse to the longitudinal axis of the rectangular reservoirs 52 and 53. Thus, the fins 56 and passageways 57 are transverse to the air flow entering and leaving the device and the outer ends of the fins 56 are positioned at an angle relative thereto. A thin metal sheet or plate 58 is secured to the top surface of the plate 51 to form a heat spreader.

The device 50 may be connected to the bottom surface of a circuit board with thermally conducting epoxy or tape or other suitable means. It should be understood that the overall dimensions of the device may vary to fit the particular circuit board or cabinet size. Air is forced through the device 50 by an external fan or blower (not shown) and a conduit connected to the inlet tube 54 and the hot exhaust air leaves through a conduit connected to the outlet tube 54.

The fluid (air) enters through the inlet tube 54 into the inlet reservoir 52, where it flows transversely across the ends of the fins 56. The ends of the fins lie on an angle relative to the air flow to make the transverse speed v of the induced turbulence entering the passageways 57 between each pair of fins approximately the same. The turbulent eddies induced by this process are transported between the fins with speed u. Also, at the exit of the fins, the transverse speed is also v, independent of location; consequently, there is less loss of dynamic pressure $\rho u^2$ as the fluid leaves the fins and enters the moving air in the tapered outlet reservoir 53.

This low pressure drop system makes it possible to use a small 12V power supply to drive a fan, such as a Shicoh Fan #0410 that is 4"×4"×½" which can deliver a mass flow rate m≈5×10⁻⁴ kg/s through the device. This also makes it possible to plug the power supply into the cigarette lighter of a car with an adapter.

If the top of the Tapered Focused Flow Heat Sink 50, the heat spreader 58, is 1/32" thick, then the passageways are 1/32" deep. Therefore, the inlet air speed is v≈6 m/s. If the fins are designed such that the speed through them is u≈6 m/s, then the heat transfer efficiency would be $$\eta \approx 1 - \exp\{-(v/u)(L/4\beta)\} \quad (9)$$
$$\approx 1 - \exp\{-(1/1)(4/(4 \times 0.125))\} \approx 1$$

with $\beta \approx 0.125" = \frac{1}{8}"$ is the horizontal width of the passageways of depth 1/32", and the width of the fin being also ⅛" makes the array of passageways ≈8"×4" in the shape of a trapezoid as shown.

Some manufacturers of notebook and laptop computers do not leave any space between the bottom of the circuit board and the cabinet; in which case, it would be difficult or impractical to insert the thin focussed flow heat sink described previously. However, many manufacturers provide an aluminum heat spreader 1/16" to ⅛" thick between a pair of circuit boards that extends across almost the entire computer cabinet. The purpose of the heat spreader is to conduct heat to it's periphery, where it can be radiated to the cabinet (usually plastic) and then delivered to the environment by free convection. Obviously, this path has a high thermal resistance, and a powerful high frequency 486 chip would overheat if running full speed. The thermal resistance of this path can be lowered by replacing the conventional aluminum heat spreader with a thin "tapered focussed flow heat sink" (TFFHS) device as previously described. The device 50 would slide between the circuit boards through a slot in the cabinet case, and the exhaust hot air would leave through a slot on the opposite side of the case. The air gaps between the top and bottom of the device and the circuit boards would be so thin that they would offer relatively small thermal resistance to heat flow from hot components on the circuit boards. This thermal resistance may be reduced further by filling in these gaps with thermal foam.

Figure 19:
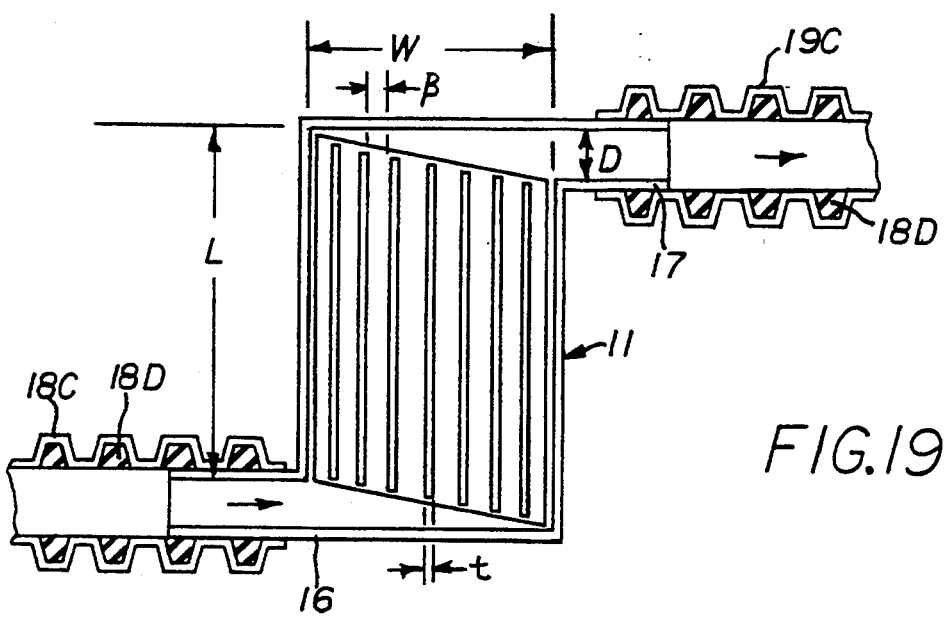
FIG. 19 is a top plan view of an enclosure positioned over an integrated circuit chip having a finned heat sink mounted thereon showing flexible corrugated conduit connected to the inlet and outlet ports.

FIG. 19 shows a Tapered Focused Flow Heat Sink (TFFHS) device inside a thermal enclosure 11 with a flexible hose or conduit 18C and 19C of circular cross section attached to the inlet and outlet ports 16 and 17, respectively. Usually, this system is designed such that it can remove heat at the rate Q, with a temperature rise of the heat sink above the ambient $\Delta T_s$, then the thermal resistance of the system is $\Delta T_s/Q$. If the fraction of the thermal input that is actually carried away by the air flow is the convection efficiency $\eta_c$, then the first law of thermodynamics gives the thermal resistance in terms of air flow rate m, heat capacity c, and thermal efficiency $\eta$ as:

$$\Delta T_s/Q = \eta_c/(mc\eta) \quad (10)$$

where the thermal efficiency is defined by the temperature rise of the air above ambient $\Delta T_0$ and $\Delta T_s$ as:

$$\Delta = \Delta T_0/T_s \quad (11)$$

Theory, verified by experiment, has shown that $\eta$ depends only on the geometric parameters of the heat sink, i.e., $$\eta \approx 1 - \exp\{-(v/u)(L/\beta)/16\} \quad (12)$$

where, $$L = W - D \quad (13)$$

and the ratio of speed across the ends of the fins to speed through the fins is:

$$v/u \approx Wf/D \qquad (14)$$

where f is the fractional opening of the fins, i.e., $$f = \beta/(\beta+t) \qquad (15)$$

Thus, these relationships determine m when the geometric parameters and the thermal parameters are given, and a reasonable estimate of convection efficiency, $\eta_c$, is made. Typically it is in the range 0.75 to 0.95.

It then follows that the speed through the fins is:

$$u = m/(\rho DWf) \qquad (16)$$

and the speed through the hoses is:

$$U = m/(\rho \pi D^2/4) \qquad (17)$$

This also determines the Reynold's number through the fins:

$$Re = \rho u \beta/\mu \qquad (18)$$

and the Reynold's number for the flow through the hoses or conduit:

$$Re' = m/\rho(\pi D^2/4) \qquad (19)$$

where $\mu$ is the viscosity of air.

For Reynold's numbers less than the critical value, 1200, the wall friction coefficient is independent of the roughness of the wall and is given by:

$$c_f = 2/Re^{\frac{1}{2}} \qquad (20)$$

and $$c_f' = 2/Re'^{\frac{1}{2}} \qquad (21)$$

in the fins and in the hoses or conduit, respectively.

Now the pressure drop contribution can be calculated as follows:
(a) Due to wall friction in the fins:

$$\Delta p_f \approx c_f (2L/\beta)(\rho u^2/2) \qquad (22)$$

(b) Due to induced turbulence in the fins:

$$\Delta p_t \approx (v/u)^2 (\rho u^2/2) \qquad (23)$$

(c) Due to wall friction in each of the two flexible hoses or conduit:

$$\Delta p_h \approx c_f'(4L/D)(\rho U^2/2) \qquad (24)$$

(d) Due to flow separation induced by the sudden expansion of the inlet air from the circular cross-section to a slightly larger square cross-section:

$$\Delta p' \approx (\rho U^2/2)\{(4/\pi)^2 - 1\} \qquad (25)$$

The total pressure drop of this system is:

$$\Delta p \approx \Delta p_f + \Delta p_t + 2\Delta p_h + \Delta p' \qquad (26)$$

Often, when the flow through the Tapered Focused Flow Heat Sink (TFFHS) device is induced by the exhaust fan in the cabinet, the available pressure drop is typically less than 1 mm of water, so the design must meet this criteria. However, if the hot CPU is cooled by the TFFHS instead of the general draft through the computer cabinet, the general draft can be reduced considerably by closing some of the openings in the exhaust fan housing. This will increase the vacuum within that housing, and hence increase the available $\Delta p$. This would then increase the mass flow rate through the TFFHS device and make more efficient utilization of the main exhaust fan because the demand for low $\Delta p$ is less strenuous.

Figure 20:
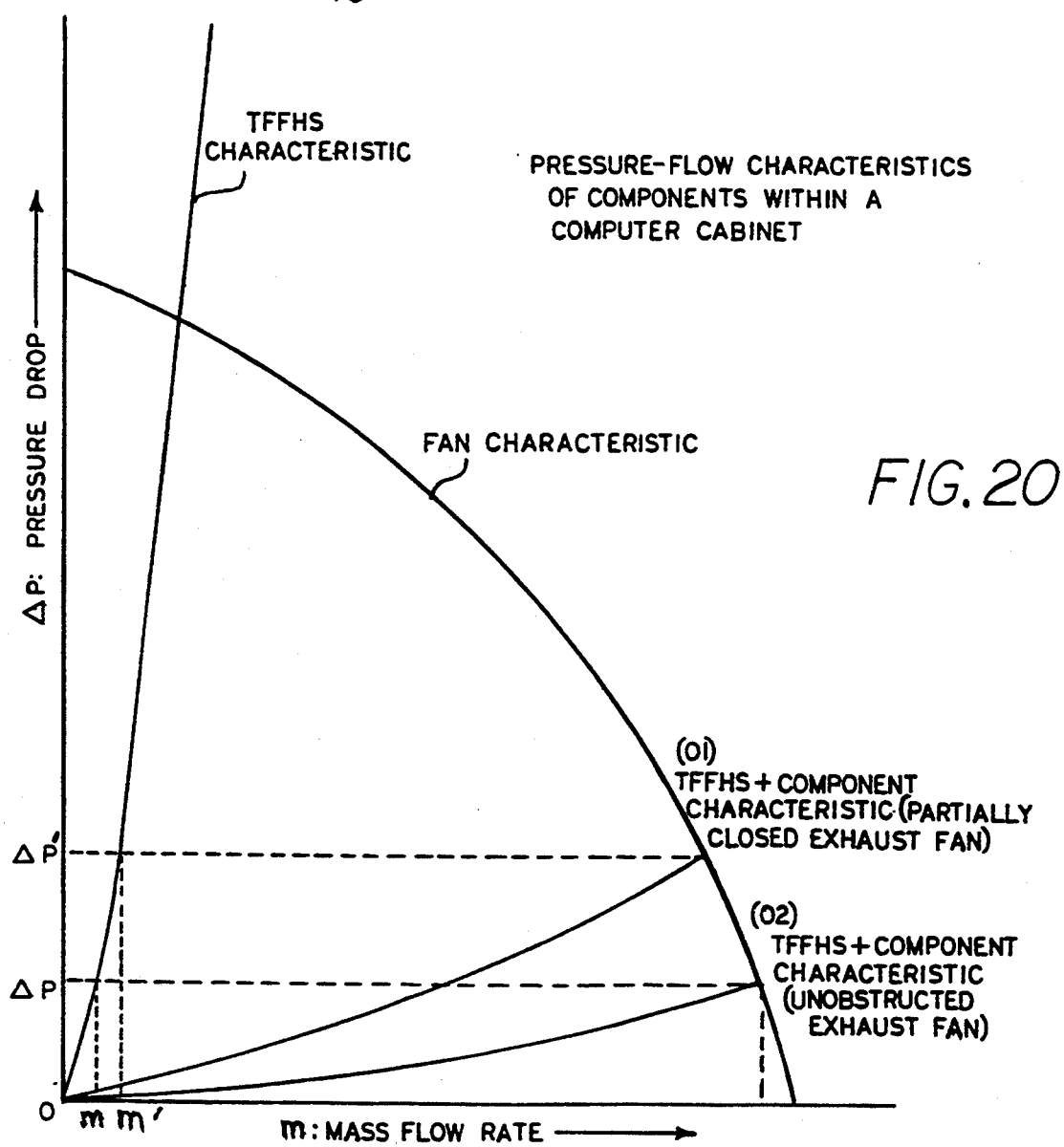
FIG. 20 is a graph showing a plot of pressure drop vs. mass flow rate with the exhaust fans open and partially closed.

FIG. 20 is a graph which shows a plot of the pressure drop vs. mass flow rate. The dashed lines refer to the operating point with openings to the fan housing unobstructed, and the dashed lines show the operating point with these openings partially closed. Note that partially closing the exhaust fan openings increases the mass flow rate through the TFFHS device, which decreases thermal resistance. It is clear that this is the better way to use the exhaust fan when there is an excessively hot spot such as a CPU to be controlled.

In some applications a dedicated fan or fans may be needed to thermally manage very large Q. This may require a mass flow rate m, speed U so large that the critical Reynold's number of 1200 is exceeded in the hoses or conduit used in the isolated air flow passageway. Thus the wall friction coefficient for the hose or conduit is no longer determined by the equations above and it is strongly dependent upon wall roughness.

A preferred type of conduit for use in forming the isolated air pathway is corrugated thin wall low density polyethylene tubing because it is flexible and also provides resistance to kinking or collapsing in a tight bend.

Referring again to FIG. 19, the tapered focused flow heat sink (TFFHS) device is shown with the inlet port 16 and outlet port 17 of the enclosure 11 connected to a flexible hose or conduit 18C and 19C, respectively. The conduits 18C and 19C are formed of corrugated tubing and the internal grooves of the tubing is filled with silicone rubber 18D to provide a smooth internal surface. This modification improves the wall friction coefficient, of the corrugated tubing without losing flexibility. The tubing may be made using low density polyethylene corrugated tubing wherein the tubing is drawn over a snug fitting extrusion head that forces silicone rubber 18D under pressure into the internal grooves over the length of the corrugated tubing, leaving a smooth wall and a flexible tubing after the rubber cures.

This same technique may also be used to smoothen the internal wall of a tube having a square cross section $D \times D$ by properly shaping the extrusion head. Such tubing will have a higher cross sectional area than a circular diameter having a diameter D by the factor $4/\pi$, and the pressure drop through it would therefore be lower by the factor $(\pi/4)^2$. Furthermore, a tube of square cross section would not have a discontinuity in cross sectional area at the inlet to the enclosure, so $\Delta p \approx 0$.

Figure 22:
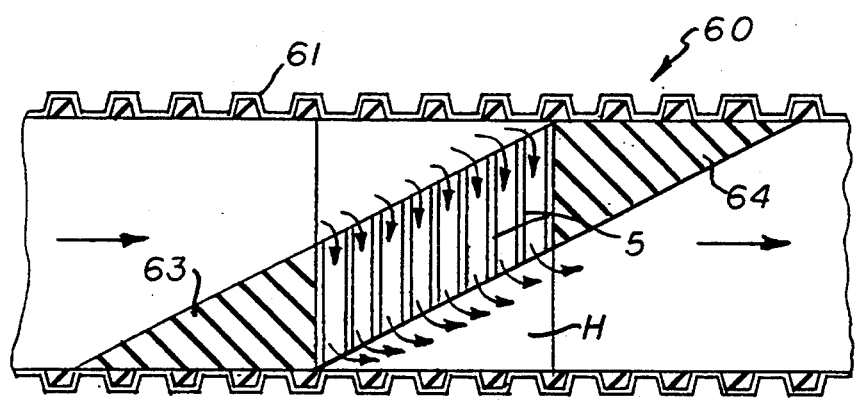
FIG. 22 is a top plan view in cross section of the embodiment of FIG. 21.
Figure 21:
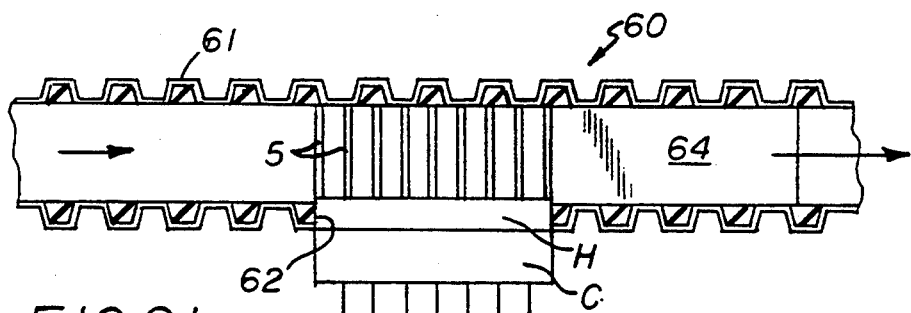
FIG. 21 is a side view in cross section of an integrated circuit chip having a finned heat sink mounted thereon which is enclosed in flexible corrugated conduit.

FIGS. 21 and 22 are longitudinal cross sectional views from the side and top, respectively, which show an embodiment of a Tapered Focused Flow Heat Sink (TFFHS) device 60 which uses flexible corrugated tubing 61 of rectangular cross section having silicone rubber in the internal grooves, as described above. In this embodiment, the rectangular tubing 61 not only serves as the isolated air pathway conduit, but also serves as the enclosure for the heat sink H or the heat generating electronic component C. An aperture 62 is formed in the bottom wall of a section of the corrugated tubing 61 such that the heat sink H or the heat generating electronic component C fits tightly in the aperture in the bottom of the tubing. When a tapered focused flow heat sink (TFFHS) device having the angularly disposed fins is used, two triangular shaped pieces 63 and 64 of soft rubber are secured adjacent the aperture 62 prior to inserting the heat sink H. The triangular pieces 63 and 64 form tapered inlet and outlet nozzles that make the inlet contribution to the overall pressure drop negligible. In fact, in such designs, most of the pressure drop will be contributed by wall friction in the heat sink fins $\Delta p_f$ and turbulence induced in the fins $\Delta p_t$.

Figure 23:
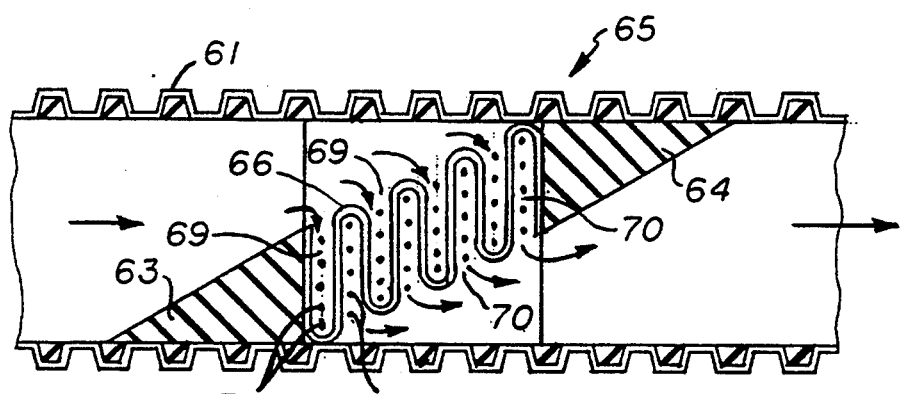
FIG. 23 is a top plan view in cross section of a "retro-jet" cooling device enclosed in flexible corrugated conduit attached to an integrated circuit chip.
Figure 24:
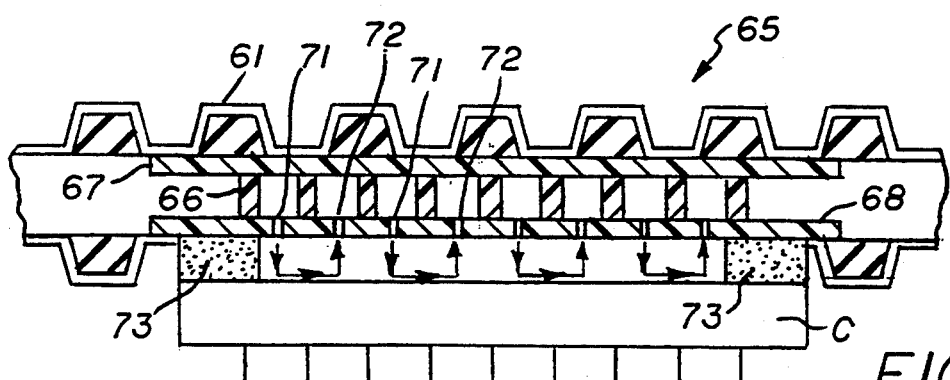
FIG. 24 is an enlarged side view in cross section showing the air flow path of the embodiment of FIG. 23.

FIGS. 23 and 24 show a "retrojet" focused flow heat sink device 65 installed in the rectangular corrugated flexible tubing 61. The "retrojet" focused flow heat sink device 65 has a long ribbon 66 of predetermined height shaped in a serpentine form with a thin flat top plate 67 secured to the top edges and a thin flat bottom plate 68 secured to the bottom edges. The serpentine ribbon 66 and top and bottom plates 67 and 68 define a series of parallel enclosed inlet passageways 69 separated by outlet passageways 70. The open ends of the passageways 69 and 70 lie on an angle relative to the air flow and the outlet passageways are blocked off at the inlet end, which the inlet passageways are blocked off at the far end. Two triangular shaped pieces 63 and 64 of soft rubber are secured adjacent each open end of the serpentine ribbon 66 to form tapered inlet and outlet nozzles. The bottom plate 68 has a plurality of rows of closely spaced small holes 71 and 72. The holes 70 are aligned with the center of the inlet passageways 69 and the holes 71 are aligned with the center of the outlet passageways 70. The bottom plate 68 is secured a predetermined distance above the top surface of a heat generating electronic component C by a frame of double sided thermal tape 73.

As shown in FIG. 24, the air flowing in the inlet passageways 69 can go only through the inlet holes 71 which convert the air flow into air jets that strike the surface of the heat generating electronic component C which is maintained a distance below the bottom plate 68 by the frame of double sided tape. The flow from neighboring jets merge on the surface of the component C and then form outlet jets that return through outlet holes 72 into the outlet passageways 70 and are exhausted through the conduit 61.

While this invention has been described fully and completely with special emphasis upon a preferred embodiment, it should be understood that within the scope of the appended claims the invention may be practiced otherwise than as specifically described herein.

I claim:

1. A method of cooling electronic components within a cabinet comprising the steps of:
   enclosing at least one predetermined heat generating electronic component inside a cabinet to isolate it from other electronic components in the cabinet;
   providing an isolated air flow pathway to conduct air from the cabinet exterior, across the enclosed heat generating electronic component, and exhaust the air to the cabinet exterior, said isolated air flow pathway being isolated from ambient air inside the cabinet;
   providing turbulence inducing means in said isolated air flow pathway at one end of the enclosed heat generating electronic component, and
   conducting air through said isolated air flow pathway and across said turbulence inducing means such that the turbulent air flows across the enclosed heat generating electronic component, whereby
   the enclosed heat generating electronic component is cooled independently of the non-isolated components and the heat generated by the enclosed heat generating electronic component and the non-isolated components is not mixed within the cabinet to maximize cooling of all components within the cabinet, and
   the turbulent air flow prevents the formation of a laminar boundary layer of air on the surface of the enclosed heat generating electronic component to maximize heat transfer.

2. The method of cooling electronic components according to claim 1 wherein;
   said turbulence inducing means includes a plurality of perforations configured to convert the air flow in the isolated air flow pathway into a multiplicity of small vortices, and
   said step of conducting air through said isolated air flow pathway and across said turbulence inducing means causes the turbulent air to flow across the enclosed heat generating electronic component in a multiplicity of small vortices.

3. The method of cooling electronic components according to claim 1 wherein;
   said enclosed heat generating electronic component includes a heat sink member in thermal contact therewith having heat conduction means for conducting heat generated by the enclosed heat generating electronic component, and
   said step of conducting air through said isolated air flow pathway and across said turbulence inducing means causes the turbulent air to flow across the heat sink member.

4. The method of cooling electronic components according to claim 1 wherein;
   said enclosed heat generating electronic component includes a heat sink member in thermal contact therewith having a series of parallel spaced longitudinal fins for conducting heat generated by the enclosed heat generating electronic component, and
   said step of conducting air through said isolated air flow pathway and across said turbulence inducing means causes the turbulent air to flow between said fins.

5. The method of cooling electronic components according to claim 4 wherein;
   said turbulence inducing means includes a plurality of perforations configured to convert the air flow in the isolated air flow pathway into a multiplicity of small vortices, and
   said step of conducting air through said isolated air flow pathway and across said turbulence inducing means causes the turbulent air to flow between said fins in a multiplicity of small vortices.

6. The method of cooling electronic components according to claim 4 wherein;
   said step of providing turbulence inducing means includes directing the air flowing through said isolated air flow pathway at opposite ends of said fins to flow transverse to the longitudinal axis of said fins to convert the air flowing between said fins into a plurality of small eddies.

7. The method of cooling electronic components according to claim 6 wherein;
said step of providing turbulence inducing means includes directing the transverse air flow at said opposite ends of said fins through a tapered inlet at one end and a tapered outlet at the opposite end of said fins, and
said inlet and outlet being tapered relative to the longitudinal axis of said fins to make the air speed entering and exiting between each of said fins substantially uniform and convert the air entering and exiting between said fins into a plurality of small eddies of substantially uniform turbulence.

8. The method of cooling electronic components according to claim 6 wherein;
said step of providing turbulence inducing means includes directing the transverse air flow at said opposite ends of said fins through an inlet at one end and an outlet at the opposite end of said fins, and
said inlet being gradually reduced in cross sectional area such that the transverse air speed remains substantially constant and converts the air entering between each of said fins into a plurality of small eddies of substantially uniform turbulence.

9. The method of cooling electronic components according to claim 8 wherein;
said outlet being gradually increased in cross sectional area to minimize the turbulence of said pluralities of small eddies exiting from between each of said fins and associated pressure loss as air flows out of said fins.

10. The method of cooling electronic components according to claim 6 wherein;
said step of providing turbulence inducing means includes aligning the opposite ends of each one of said plurality of fins at an angle relative to the transverse air flow at said opposite ends of said fins to make the air speed entering and exiting between each of said fins substantially uniform and convert the air entering and exiting between said fins into a plurality of small eddies of substantially uniform turbulence.

11. A method of cooling electronic components within a cabinet comprising the steps of:
enclosing at least one predetermined heat generating electronic component inside a cabinet to isolate it from other electronic components in the cabinet;
providing an isolated air flow pathway to conduct air from the cabinet exterior, across the enclosed heat generating electronic component, and exhaust the air to the cabinet exterior, said isolated air flow pathway being isolated from ambient air inside the cabinet;
providing inlet means upstream from said enclosed heat generating electronic component and outlet means downstream from said heat generating electronic component in said isolated air flow pathway, said inlet means having a cross sectional area gradually reduced in the direction of air flow and said outlet means having a cross sectional area gradually increased in the direction of air flow, said cross sectional areas being sized to reduce the pressure drop across said enclosed heat generating electronic component; and
conducting air through said isolated air flow pathway through said inlet means, across said heat generating electronic component, and through said outlet means; whereby
the enclosed heat generating electronic component is cooled independently of the non-isolated components and the heat generated by the enclosed heat generating electronic component and the non-isolated components is not mixed within the cabinet to maximize cooling of all components within the cabinet; and
the cross sectional areas of said inlet means and said outlet means reduce the pressure drop across the enclosed heat generating electronic component.

12. The method of cooling electronic components according to claim 11 wherein;
said enclosed heat generating electronic component includes a heat sink member in thermal contact therewith having heat conduction means for conducting heat generated by the enclosed heat generating electronic component, and
said step of conducting air through said isolated air flow pathway through said inlet means, across said heat generating electronic component, and through said outlet means includes conducting air across said heat sink member.

13. Apparatus for cooling electronic components within a cabinet comprising:
an enclosure formed of electrically non-conductive material having an interior cavity configured to enclose at least one predetermined heat generating electronic component and isolate it from other electronic components in the cabinet;
air inlet means on said enclosure adapted to be connected with the cabinet exterior and air outlet means on said enclosure adapted to be connected with the cabinet exterior to define an isolated air flow pathway from the cabinet exterior, across the enclosed heat generating electronic component, and to the cabinet exterior, said isolated air flow pathway being isolated from ambient air inside the cabinet, and said inlet and outlet means adapted to be connected with a fan for conducting air through said isolated air flow pathway;
turbulence inducing means in said isolated air flow pathway closely adjacent a surface of the enclosed heat generating electronic component, and
the fan in operation conducting air through said isolated air flow pathway and across said turbulence inducing means such that the turbulent air flows across the enclosed heat generating electronic component, whereby
the enclosed heat generating electronic component is cooled independently of the non-isolated components and the heat generated by the enclosed heat generating electronic component and the non-isolated components is not mixed within the cabinet to maximize cooling of all components within the cabinet, and
the turbulent air flow substantially reduces the formation of a thick laminar boundary layer of air on the surface of the enclosed heat generating electronic component to maximize heat transfer.

14. The apparatus according to claim 13 in which;
said turbulence inducing means includes a plurality of perforations configured to convert the air flow in the isolated air flow pathway into a multiplicity of small vortices which flow across the enclosed heat generating electronic component in a multiplicity of small vortices.

15. The apparatus according to claim 13 in which;
said enclosed heat generating electronic component includes a heat sink member in thermal contact therewith having heat conduction means for conducting heat generated by the enclosed heat generating electronic component, and
said turbulence inducing means is configured to cause the turbulent air to flow across the heat sink member.

16. The apparatus according to claim 13 in which;
said enclosed heat generating electronic component includes a heat sink member in, thermal contact therewith having a series of parallel spaced longitudinal fins for conducting heat generated by the enclosed heat generating electronic component, and
said turbulence inducing means is configured to cause the turbulent air to flow between said fins.

17. The apparatus according to claim 16 in which;
said turbulence inducing means includes a plurality of perforations configured to convert the air flow in said isolated air flow pathway into a multiplicity of small vortices which flow between said fins in a multiplicity of small vortices.

18. The apparatus according to claim 16 in which;
said inlet and outlet means is configured to direct the air flowing through said isolated air flow pathway at opposite ends of said fins to flow transverse to the longitudinal axis of said fins to convert the air flowing between said fins into a plurality of small eddies.

19. The apparatus according to claim 18 in which;
said inlet and outlet means are tapered relative to the longitudinal axis of said fins to make the air speed entering and exiting between each of said fins substantially uniform and convert the air entering and exiting between said fins into a plurality of small eddies of substantially uniform turbulence.

20. The apparatus according to claim 16 in which;
said inlet means is gradually reduced in cross sectional area such that the transverse air speed remains substantially constant and converts the air entering between each of said fins into a plurality of small eddies of substantially uniform turbulence.

21. The apparatus according to claim 20 in which;
said outlet means is gradually increased in cross sectional area to minimize the turbulence of said pluralities of small eddies exiting from between each of said fins and associated pressure loss as air flows out of said fins.

22. The apparatus according to claim 16 in which;
the opposite ends of said parallel spaced longitudinal fins are aligned at an angle relative to the transverse air flow at said opposite ends to make the air speed entering and exiting between each of said fins substantially uniform and convert the air entering and exiting between said fins into a plurality of small eddies of substantially uniform turbulence. rate.

23. The apparatus according to claim 13 wherein;
said air inlet means and said air outlet means include an air inlet port and an air outlet port on said enclosure each in fluid communication with said interior cavity for directing air through said interior cavity of said enclosure, and
conduit means connecting said air inlet port and said outlet port with the exterior of the cabinet and with the fan to isolate said isolated air flow pathway from the ambient air inside the cabinet.

24. The apparatus according to claim 23 further comprising
connector means for connecting at least one end of said conduit means with the the fan top to conduct air through said conduit to the exterior of the cabinet.

25. The apparatus according to claim 23 wherein;
said conduit means is formed of corrugated tubing having a smooth interior surface.

26. The apparatus according to claim 23 wherein;
said conduit means is formed of flexible corrugated tubing having a interior grooves filled with elastomeric material to provide a smooth interior surface.

27. The apparatus according to claim 13 wherein
said enclosure, said air inlet means, and said air outlet means are an integral unit formed of a single length of conduit having an aperture through its side wall which is configured to receive and surround said at least one predetermined heat generating electronic component and isolate it from other electronic components in the cabinet; and
said single length of conduit adapted to be connected at opposite ends with the cabinet exterior to define said isolated air flow pathway and at least one of said opposite ends adapted to be connected with the fan for conducting air through said isolated air flow pathway.

28. The apparatus according to claim 27 wherein
said turbulence inducing means comprises a tapered surface on the interior of said single length of conduit closely adjacent a surface of the enclosed heat generating electronic component.

29. Apparatus for cooling electronic components within a cabinet comprising:
an enclosure formed of electrically non-conductive material having an interior cavity configured to enclose at least one predetermined heat generating electronic component and isolate it from other electronic components in the cabinet;
air inlet means on said enclosure adapted to be connected with the cabinet exterior and air outlet means on said enclosure adapted to be connected with the cabinet exterior to define an isolated air flow pathway from the cabinet exterior, across the enclosed heat generating electronic component, and to the cabinet exterior, said isolated air flow pathway being isolated from ambient air inside the cabinet, and said inlet and outlet means adapted to be connected with a fan for conducting air through said isolated air flow pathway;
said air inlet means having a gradually reduced cross sectional area upstream from said heat generating electronic component and said air outlet means having a gradually increased cross sectional area downstream from said heat generating electronic component, and said cross sectional areas being sized to reduce the pressure drop across said enclosed heat generating electronic component;
the fan in operation conducting air through said isolated air flow pathway, through said inlet means reduced cross sectional area, across said heat generating electronic component, and through said outlet means increased cross sectional area, whereby said enclosed heat generating electronic component is cooled independently of the non-isolated components and the heat generated by said enclosed heat generating electronic component and the non-isolated components is not mixed within the cabinet to maximize cooling of all components within the cabinet, and the cross sectional areas of said inlet means and said outlet means substantially reduces the pressure drop across said enclosed heat generating electronic component.

30. A cabinet for containing and cooling heat generating electronic components comprising:

a cabinet housing having mounting means for mounting electronic components thereon;

a plurality of electronic components including heat generating electronic components mounted on said mounting means;

an enclosure formed of electrically non-conductive material having an interior cavity configured to enclose at least one predetermined heat generating electronic component and isolate it from other electronic components in said cabinet housing;

air inlet means and air outlet means on said enclosure each connected with the exterior of said cabinet housing to define an isolated air flow pathway from said cabinet housing exterior, across said enclosed heat generating electronic component, and to said cabinet housing exterior, said isolated air flow pathway being isolated from ambient air inside said cabinet housing, and said inlet and outlet means adapted to be connected to a fan for conducting air through said isolated air flow pathway;

turbulence inducing means in said isolated air flow pathway closely adjacent a surface of said enclosed heat generating electronic component; and the fan in operation conducting air through said isolated air flow pathway and across said turbulence inducing means such that the turbulent air flows across said enclosed heat generating electronic component; whereby said enclosed heat generating electronic component is cooled independently of the non-isolated components and the heat generated by said enclosed heat generating electronic component and the non-isolated components is not mixed within said cabinet housing to maximize cooling of all components within said cabinet housing; and the turbulent air flow substantially reduces the formation of a thick laminar boundary layer of air on the surface of the enclosed heat generating electronic component to maximize heat transfer.

31. The cabinet according to claim 30 wherein said air inlet means has a gradually reduced cross sectional area upstream from said heat generating electronic component and said air outlet means has a gradually increased cross sectional area downstream from said heat generating electronic component, and the cross sectional areas of said inlet means and said outlet means are sized to substantially reduce the pressure drop across said enclosed heat generating electronic component.

* * * * *